United States Patent [19]

Patalong

[11] 4,454,527

[45] Jun. 12, 1984

[54] THYRISTOR HAVING CONTROLLABLE EMITTER SHORT CIRCUITS AND A METHOD FOR ITS OPERATION

[75] Inventor: Hubert Patalong, Munich, Fed. Rep. of Germany

[73] Assignee: Siemens Aktiengesellschaft, Berlin & Munich, Fed. Rep. of Germany

[21] Appl. No.: 252,356

[22] Filed: Apr. 9, 1981

[30] Foreign Application Priority Data

May 14, 1980 [DE] Fed. Rep. of Germany ....... 3018468

[51] Int. Cl.³ .................... H01L 29/74; H01L 29/78
[52] U.S. Cl. ........................................ 357/38; 357/23; 357/86
[58] Field of Search ................. 357/38, 35, 86, 39, 357/23 VD

[56] References Cited

U.S. PATENT DOCUMENTS

| | | | |
|---|---|---|---|
| 3,891,866 | 6/1975 | Okuhara et al. | 357/38 |
| 4,224,634 | 9/1980 | Svedberg | 357/86 |
| 4,244,000 | 1/1981 | Ueda et al. | 357/38 |

FOREIGN PATENT DOCUMENTS 2945324 5/1981 Fed. Rep. of Germany .
2945366 5/1981 Fed. Rep. of Germany .

OTHER PUBLICATIONS

Munoz-Yague et al., "Optimum Design of Thyristor G-to-Emitter Geometry," *IEEE Trans. on Electron Devices*, vol. ED-23, No. 8, Aug. 1976.

*Primary Examiner*—Martin H. Edlow
*Assistant Examiner*—J. L. Badgett
*Attorney, Agent, or Firm*—Hill, Van Santen, Steadman & Simpson

[57] ABSTRACT

A thyristor which has outer emitter layers of opposite conductivity types and intermediate base layers of respective opposite conductivity types and metal-insulated-semiconductor emitter short circuit structures including a semiconductor region inserted in one of the outer emitters and doped opposite thereto and connected to the electrode carried thereby has an electrically conductive coating, connected to a terminal, carried on the boundary surface of the semiconductor body which contains the emitter layer having the MIS structure, a lateral zone of the conductive coating being insulated from the boundary surface and forming a gate electrode of the MIS structure and another zone which contacts the boundary surface and forms the trigger electrode.

10 Claims, 4 Drawing Figures

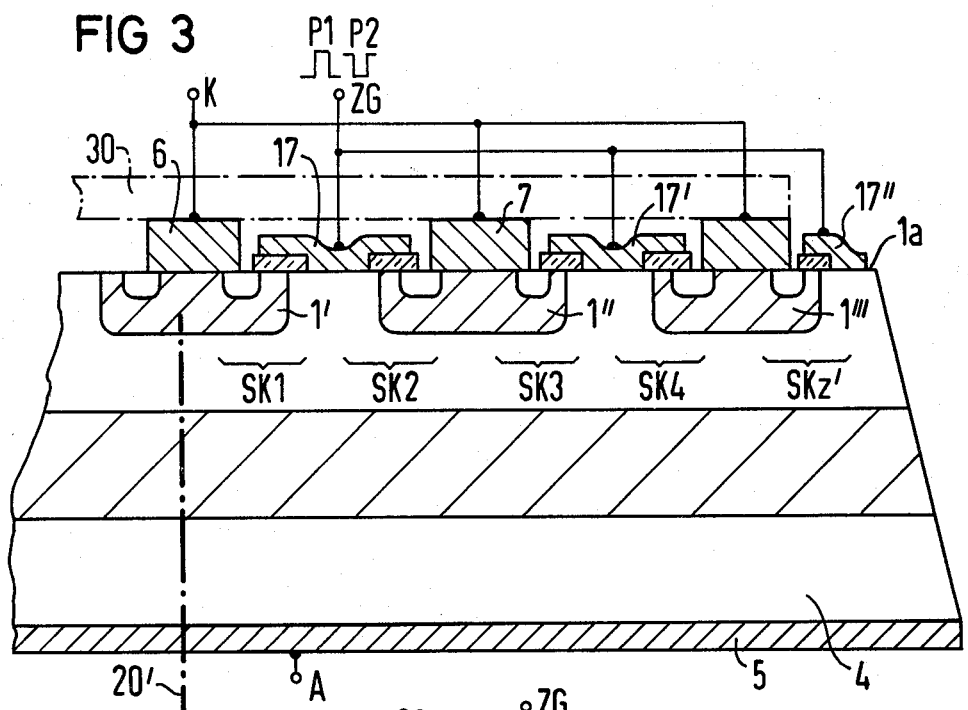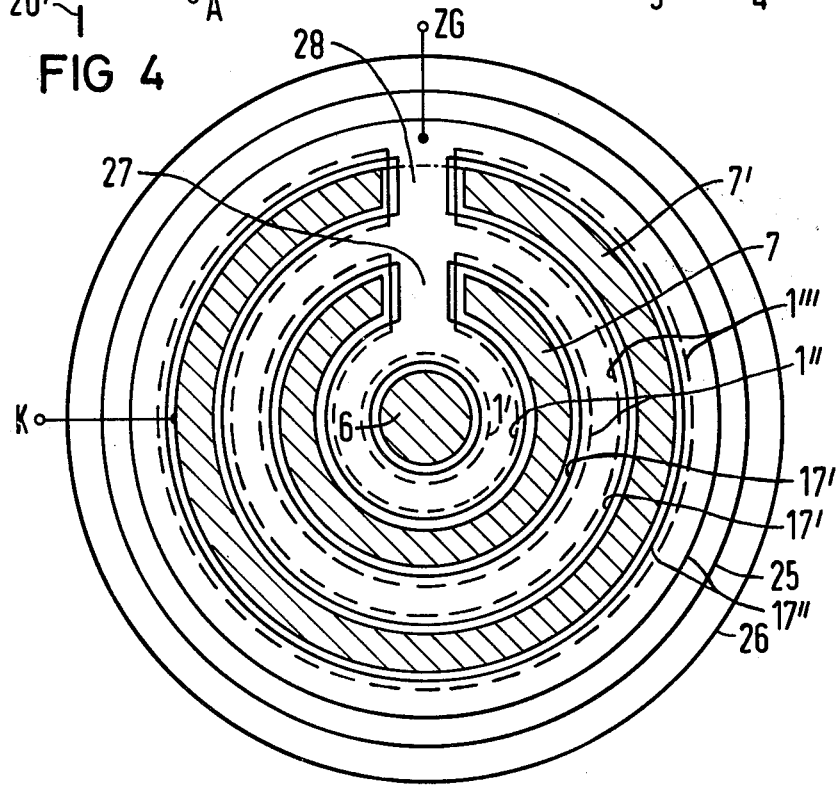

THYRISTOR HAVING CONTROLLABLE EMITTER SHORT CIRCUITS AND A METHOD FOR ITS OPERATION

BACKGROUND OF THE INVENTION

1. Field of the Invention

The present invention relates to a thyristor having controllable short circuits, and more particularly to such a device which contains an outer emitter layer of one conductivity carrying an electrode, an outer emitter of the opposite conductivity carrying an electrode, and two base layers respectively adjacent thereto and therebetween, with at least one emitter short circuit located at the edge of the first-mentioned emitter layer and designed as a metal-insulator-semiconductor (MIS) structure, the emitter short circuit consisting of a semiconductor region inserted in the first-mentioned emitter layer and doped opposite thereto and extending up to the boundary surface of the semiconductor body and conductively connected to the first-mentioned electrode, and further consisting of a zone of the base layer adjacent that emitter layer and of an intermediate layer which is formed by a portion of that emitter layer and is covered by a gate electrode carried on insulation, the thyristor having a trigger electrode applied to a base layer, and to a method for the operation of such a device.

2. Description of the Prior Art

Thyristors of the type generally set forth above are disclosed in the German patent application Nos. P 29 35 366.5 and P 29 45 324.5. When the controllable emitter short circuits are designed as depletion type MIS structures, then, without the supply of a control votlage to their gate electrodes, they respectively close a short circuit path which bridges the pn junction between the emitter layer connected to the cathode (anode) and the adjacent base layer. Therefore, the thyristor exhibits good stability, i.e. higher security against unintentional trigger operations upon occurrence of voltages at the anode/cathode elements which are poled in the forward conducting direction, the voltages sometimes rising very quickly (high dU/dt load). If the thyristor is triggered by a current pulse supplied to its trigger electrode, then a trigger voltage pulse which can be tapped at the trigger electrode can be applied to the gate electrodes of the controlled emitter short circuits so that the same are suppressed for the duration of triggering. The suppression represents a turn-on measure and results in the fact that a fast, controlled triggering occurs over the entire thyristor cross section. If, on the other hand, controllable emitter short circuits are designed as enhancement type MIS structures, then the same are inoperative without the supply of a control voltage to their gate electrodes and are only switched on by a control voltage pulse which exhibits the opposite polarity of the trigger voltage pulse and for the duration of the control voltage pulse. Such a control occurs in the current-conducting state of the thyristor for the purpose of achieving a fast blocking of the thyristor, and thus represents a turn-off measure.

SUMMARY OF THE INVENTION

The object of the present invention is to significantly simplify the structure of the thyristor of the type generally set forth above having controllable short circuits.

The above object is achieved, in a device of the type set forth above which is characterized in that at least one electrically conductive layer carrying a terminal is applied to the boundary surface of the semiconductor body which contains the first-mentioned emitter layer, the edge zone of the conductive layer being insulated from the boundary surface and representing a gate electrode of the MIS structure, whereas the zone of the layer which contacts the boundary surface forms the trigger electrode.

The advantage which can be achieved with the present invention, in particular, is that the trigger electrode and the gate electrodes of the controllable emitter short circuits comprise one and the same conductive layer whose edge zones are insulated from the boundary surface of the semiconductor body, whereas another portion of the conductive layer contacts the boundary surface. The conductive layer is provided with a terminal which represents both the terminal for the trigger electrode and the control voltage terminal for the gate electrodes of the MIS structures.

BRIEF DESCRIPTION OF THE DRAWINGS

Other objects, features and advantages of the invention, its organization, construction and operation will be best understood from the following detailed description, taken in conjunction with the accompanying drawings, on which:

FIG. 3 is a schematic sectional view of a third exemplary embodiment of the invention; and FIG. 4 is a plan view of the exemplary embodiment of FIG. 3.

DESCRIPTION OF THE PREFERRED EMBODIMENTS

Figure 1:
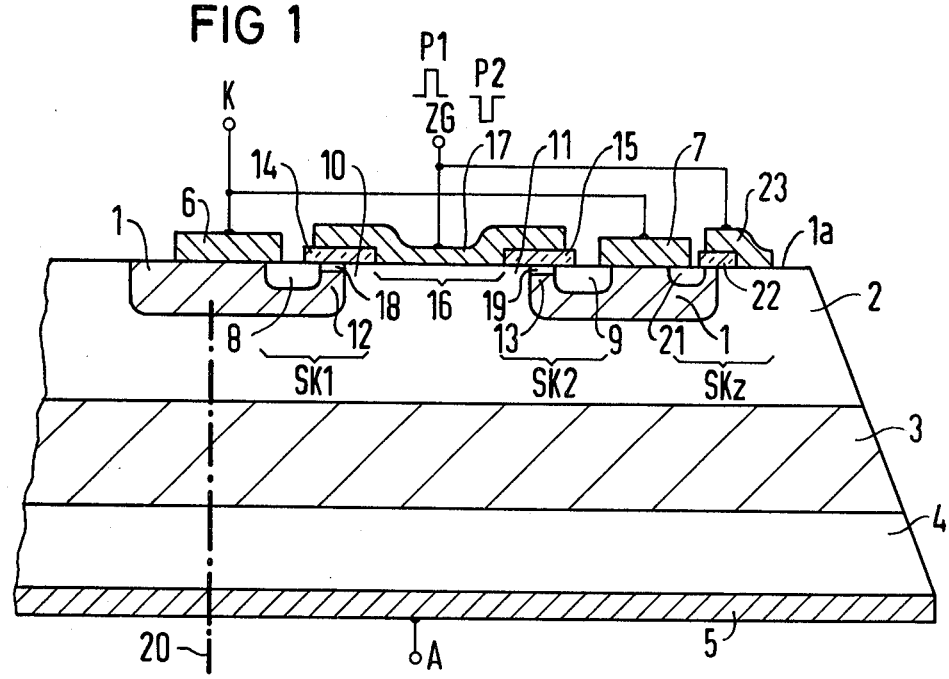
FIG. 1 is a schematic sectional view of a first exemplary embodiment of the invention.

In FIG. 1, a thyristor is illustrated, in section, as comprising a semiconductor body with a plurality of superposed layers 1–4 of alternating conductivity types which comprise, for example, doped silicon. In the example illustrated, an n-conductive layer 1 is an outer n-emitter layer and a p-conductive layer 4 is an outer p-emitter layer. Base layers are respectively adjacent to the emitter layers, in particular, a p-base layer 2 is adjacent the n-emitter layer 1 (has the n-emitter layer 1 located therein) and an n-base layer 3 is adjacent the p-base layer 2 and the p-emitter layer 4. The p-emitter layer 4 is provided with an anode 5 which exhibits an anode terminal A, whereas the n-emitter layer 1 is subdivided into two n-emitter zones which are laterally adjacent one another. Each of the emitter zones is provided with a portion 6, 7 of a cathode, whereby the individual portions of the cathode are conductively connected to one another and to a common cathode terminal K.

P-conductive semiconductor regions 8 and 9 are located within the n-emitter zone 1 in such a manner that they extend up to the boundary surface 1a of the semiconductor body and are contacted in the semiconductor body at an edge thereof by the portions 6, 7 of the cathode. Individual zones of the p-base layer 2 are referenced 10 and 11, extend from the boundary surface 1a and are laterally adjacent those portions of the n-emitter zones which contain the semiconductor regions 8, 9 respectively. A portion 12 of the left n-emitter zone 1 represents an n-intermediate layer which separates the p-conductive semiconductor region 8 and the p-conductive zone 10 from one another. In an analogous manner, the portion 13 of the right-n-emitter zone 1 forms an n-intermediate layer between the portions 9 and 11. Thin, electrically insulating layers 14 and 15 consisting, for example, of SiO$_2$, are provided on the boundary surface 1a, the layers 14 and 15 leaving a region 16 of the boundary surface 1a free therebetween. An electrically-conductive layer 17 which, for example, consists of metal or of highly-doped polycrystalline silicon, is disposed in such a manner that its edge zones cover the insulating layers 14 and 15 and, therefore, the n-intermediate layers 12, 13 and contacts the p-base layer 12 in a central zone within the region 16 of the boundary surface 1a.

Together, the parts 8, 10, 12, 14 form with the left edge zone of the conductive coating 17 a first MIS structure; the parts 9, 11, 13, 15 form with the right edge zone of the layer 17 a second MIS structure. The edge zones of the layer 17 thereby represent the gate electrodes of the MIS structures; the central portion of the layer which contacts the p-base layer 2 represents the trigger electrode of the thyristor. If the MIS structures are of the depletion type, then, without the influence of a voltage on the layer 17, p-conductive channels 18, 19 are located at the boundary surface 1a, the channels, respectively conductively connecting the zone 10 to the semiconductor region 8 and the zone 11 to the semiconductor region 9. If, with respect to the cathode terminal K, positive control voltage of a sufficient magnitude is applied to the terminal ZG, then the channels 18, 19 are eliminated. If the MIS structure is of the enhancement type, then no channels 18, 19 exist without the supply of a voltage to the terminal ZG. These are only built up by means of the application of a voltage to the terminals ZG which is negative with respect to the cathode terminal K and which exceeds the threshold voltage.

The p-conductive channel 18, therefore, represents the contact-break distance of a controllable short circuit SK1 which either forms or does not form a low-resistance connection between the p-base layer 2 and the region 8 and, therefore, with the portion 6 of the cathode depending on the control voltage supplied to the terminal ZG. In the same manner, the channel 19 forms the contact-break distance of a controllable emitter short circuit SK2 which, as a function of the control voltage supplied to the terminal ZG, optionally conductively connects the p-base layer 2 to the portion 7 of the cathode.

In a first embodiment of the invention, the emitter short circuits SK1 and SK2 are switched inoperative only for the duration of the trigger operation and are always operative before and after the trigger operation. Thereby, the MIS structures 8, 10, 12, 14, 17 and 9, 11, 13, 15, 17 can advantageously belong to the depletion type. The short circuits SK1, SK2 are then at first operative without the supply of a voltage to the terminal ZG and stabilize the thyristor with respect to high dU/dt loads which occur in the blocked state. The thyristor triggers by the application of a positive trigger pulse P1 to the terminal ZG, whereby the emitter short circuits SK1 and SK2 are switched inoperative at the same time during the duration of the pulse P1, so that the respectively triggered surface quickly expands in the lateral direction over the entire cross surface of the thyristor. In the triggered state, a load current of a load circuit connected at the terminals A and K then flows across the thyristor which is in the low-resistance condition.

The turn-off of the thyristor is achieved by turning off the voltage applied in the forward conducting direction between the terminal A and K or, in case it is a matter of an alternating current, by the next successive zero crossing.

It can be desirable for some applications to employ MIS structures of the enhancement type within the framework of the first embodiment. In this case, the terminal ZG in the blocked state of the thyristor lies at a negative bias voltage under whose influence inversion channels 18, 19 are built up. From the time of triggering, the negative bias voltage is then disconnected from the terminal ZG and a positive trigger pulse P1 is supplied. However, there is also the possibility of leaving the negative bias voltage connected and superimposing a sufficiently large trigger pulse P1 thereon. In each of these cases, the inversion channels 18, 19 are interrupted during the trigger operation.

According to a second embodiment of the invention, the emitter short circuits SK1 and SK2 are only turned on when the thyristor is turned off, whereby the thyristor changes from the current-conducting state into the blocked state without the voltage applied at the terminals A and K in the forward conducting direction being switched off, and the short circuits are always inoperative before and after the turn-off operation. If the MIS structures are the enhancement type, then the triggering is indeed effected by the application of the positive trigger pulse P1, but the blockage of the emitter short circuits SK1 and SK2 is not eliminated. Only when a negative pulse P2 is supplied to the terminal ZG does the shut-down of the thyristor occur due to the turn-on of the circuits SK1 and SK2.

In a third embodiment of the invention, it is provided that the one MIS structure, for example, the structure 8, 10, 12, 14, 17 belongs to the depletion type and the other MIS structure, for example, the structure 9, 11, 13, 15, 17 is of the enhancement type. With this type of structure, the emitter short circuit SK1 is only switched inoperative upon occurrence of the positive trigger pulse P1, i.e. during the trigger operation and is always inoperative before and after the trigger operation, whereas the circuit SK2 is only switched operative when the negative pulse P2 is applied, i.e. during the shut-down of a thyristor, and is always inoperative at other times. In this case, the short circuit SK1 serves as a turn-on aid, whereas the short circuit SK2 represents a turn-off aid.

In FIG. 1, according to a further development, a p-conductive semiconductor region 21 can also be provided at the right-hand edge of the right emitter zone 1. Together with a thin, electrically insulating layer 22 and a conductive layer 23, whose left-hand portion forms a gate electrode connected to the terminal ZG, it represents an additional, controllable emitter short circuit SKz which, in accordance with the first and second embodiments, is respectively designed and operated like the short circuits SK1 and SK2. In the third embodiment, the MIS structure 21, 22, 23 is preferably of the depletion type, so that the short circuit SKz is only switched operative during the shut-down of the thyristor. The right-hand portion of the conductive layer 23 contacts the p-base layer 2 and represents a further portion of the trigger electrode.

The n-emitter zones 1 of FIG. 1 can be designed longitudinally extended, so that they exhibit significantly greater dimensions perpendicular to the plane of the drawing than they do within the drawing plane.

Advantageously, they then extend as straight-lines and parallel with respect to one another over the entire boundary surface 1a of the thyristor which is generally designed as a round disc. Therefore the line 20 can be interpreted as a plane of symmetry which lies perpendicular to the plane of the drawing. The cathode portion carried by the n-emitter zone provided to the left of the line 20 is then likewise connected to the terminal K, whereas the allocated, conductive layers are connected to the terminal ZG. On the other hand, the thyristor of FIG. 1 can also be designed rotationally symmetrical, whereby the line 20 represents the axis of symmetry. In this case, the portion 6 of the cathode and the left-hand emitter zone 1 respectively exhibit a circular outline, whereas the parts 7, 17 and 23, as well as the right-hand emitter zone 1, are annularly designed.

Figure 2:
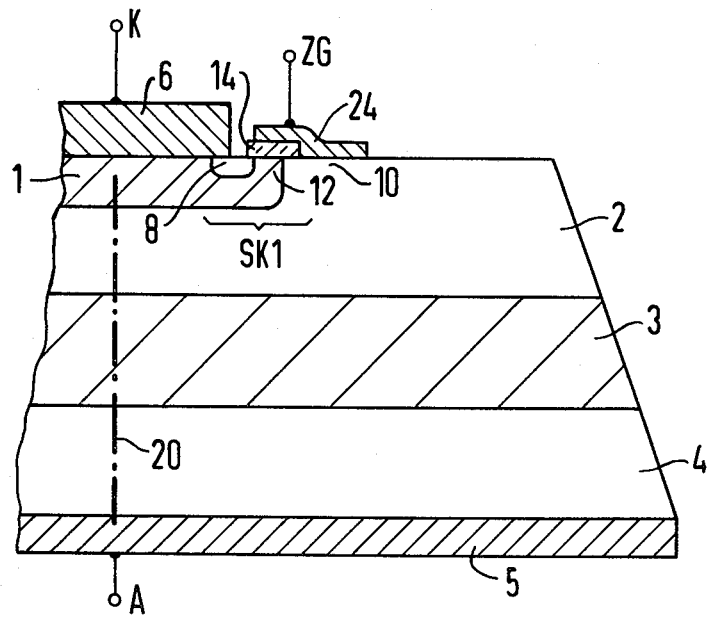
FIG. 2 is a schematic sectional view of a second exemplary embodiment of the invention.

FIG. 2 illustrates an exemplary embodiment which is simplified in comparison to FIG. 1 in which the n-emitter layer comprises only one emitter zone 1. The parts 8, 10, 12 and 14, together with a conductive layer 24 whose left-hand portion covers an insulating layer 14 and the n-intermediate layer 12, then form an emitter short circuit SK1. The right-hand portion of the layer 24 contacts the p-base layer 2 and forms the trigger electrode.

In accordance with FIG. 1, the terminal of the layer 24 is referenced ZG. The parts 1, 6 and 24 can again be designed longitudinally extended, in particular, in such a manner that they exhibit significantly greater dimensions perpendicular to the plane of the drawing than they do within the plane. Thereby, the line 20 can again be interpreted as a plane of symmetry which is perpendicular to the plane of the drawing, whereby the conductive layer corresponding to the portion 24 and lying to the left of the line is connected to the terminal ZG. On the other hand, a rotationally symmetrical format of the thyristor of FIG. 2 is likewise advantageous with the line 20 indicating the axis of symmetry. The short circuit SK1 can either be switched inoperative during the turn-on operation or can be switched operative during the turn-off operation. With the line 20 as the plane of symmetry, the controllable emitter short circuit lying to the left thereof can be of the enhancement type and that lying to the right thereof can be of the depletion type.

The exemplary embodiment illustrated in FIG. 3 differs from that of FIG. 1 in that three n-emitter zones 1'–1''' are illustrated, whereby the zone 1''' is covered by a portion 7' of the cathode which is connected to the terminal K (FIG. 4). A conductive layer 17' is disposed at the adjacent edges of the n-emitter zones 1'' and 1''', the edge portions of the conductive layer 17' being insulated with respect to the boundary surface 1a to form gate electrodes of two further, controllable emitter short circuits SK3 and SK4, whereas their central zone represents a further portion of the trigger electrode. The layer 17' is connected to the layer 17 and, thus, to the terminal ZG. Here, also, the n-emitter zones 1'–1''' can either be designed longitudinally extended, whereby the line 20' is to be interpreted as a plane of symmetry, or with a rotational symmetrical format, whereby the line 20' designates the axis of symmetry.

The individual emitter short circuits SK1–SK4 can again be designed in such a manner that they are either switched inoperative during the trigger operation and are operative during the remaining time or that they are only operative during the turn-off and are switched inoperative at all other times. If one divides the emitter short circuits into a first group which are only switched inoperative during the trigger operation and a second group which are only switched operative during the turn-off, then it is advantageous to make the second group larger than the first group. Therefore, for example, the emitter short circuits SK2–SK4 can belong to the second group (operative during turn-off) and the short circuit SK1 is assigned to the first group (inoperative during triggering). A further, controllable emitter short circuit SKz' which is constructed in accordance with the short circuit SKz of FIG. 1, can then be provided by means of a conductive layer 17'' at the right-hand edge of the emitter zone 1'''. Given a division of the emitter short circuits existing in FIG. 3 into the two groups, the emitter short circuit SKz' is assigned, for example, to the second group.

FIG. 4 is a plan view of a thyristor of the type illustrated in FIG. 3 having a rotationally symmetrical format. Thereby, the lateral dimensions of the individual n-emitter zones 1', 1'' and 1''' are illustrated with broken lines insofar as they are located under the conductive layers 17, 17' and 17''. The portions 6, 7 and 7' of the cathode are illustrated with hatching for the purpose of a clear presentation. The outer edge of the upper boundary surface of the thyristor is indicated at 25 and the outer edge of the p-emitter layer 4 is referenced 26. The annularly-shaped layers 17 and 17' are connected to one another by a connecting portion 27, the layers 17' and 17'' are connected to each other by a connection portion 28, and the layer 17'' is provided with the terminal ZG. The cathode portions 6, 7 and 7' are advantageously contacted through a cathode plate 30 (FIG. 3), whereby the cathode terminal K is attached to the cathode plate.

Instead of the n-emitter layer 1, the p-emitter layer 4, can also be subdivided into individual zones which are seized by individual portions of the anode, the individual portions being connected to one another. Thereby, controllable p-emitter short circuits are provided. This variation can be illustrated in FIGS. 1–3 when the designations of the terminals A and K are interchanged and the semiconductor portions 1–4, 8, 9 and 21 have conductivities which are opposite to those previously described. The pulse P1 is then a negative pulse and the pulse P2 is a positive pulse.

Although I have described my invention by reference to particular illustrative embodiments thereof, many changes and modifications of the invention may become apparent to those skilled in the art without departing from the spirit and scope of the invention. I therefore intend to include within the patent warranted hereon all such changes and modifications as may reasonably and properly be included within the scope of my contribution to the art.

I claim:

1. In a thyristor of the type which includes a semiconductor body having a boundary surface and formed of a first emitter of a first conductivity type at the boundary surface, a first base of a second, opposite conductivity type carrying and extending about said emitter up to the boundary surface, a second base of the first conductivity type carrying said first base, a second emitter of the second conductivity type carrying said second base, a first electrode on said first emitter, a second electrode on said second emitter, a trigger electrode on the boundary surface spaced from said first electrode, and at least one metal-insulator-semiconductor controllable emitter short circuit structure for shorting the junction between said first emitter and said first base including a region of said first conductivity type in said first emitter electrically connected to said first electrode, a zone of said first base, a portion of said first emitter, and an insulated gate carried over said emitter portion on said boundary surface, the improvement therein comprising:

a conductive layer adapted to receive control voltages and including a first section contacting the zone of the first base and serving as the trigger electrode, and a second section carried insulated over the adjacent portion of the first emitter and serving as the gate electrode of the metal-insulator-semiconductor controllable emitter short circuit.

2. The improved thyristor of claim 1, wherein: the first emitter and second base are of n-type conductivity and the first base and second emitter are of p-type conductivity.

3. The improved thyristor of claim 1, wherein:
the first emitter is divided into a plurality of first emitter zones spaced apart in the first base;
the first electrode is divided into a plurality of first electrode portions each contacting a respective first emitter zone;
the conductive layer is divided into portions disposed between neighboring first emitter zones with each portion including the first section contacting the first base and a pair of the second sections lateral of the first section and over and insulated from edge portions of the neighboring first emitter zones.

4. The improved thyristor of claim 1, wherein: the metal-insulator-semiconductor controllable short circuits are depletion type structures.

5. The improved thyristor of claim 1, wherein: the metal-insulator-semiconductor controllable short circuits are enhancement type structures.

6. The improved thyristor of claim 1, wherein: the metal-insulator-semiconductor controllable short circuits are divided into a first group of depletion type structures and a second group of enhancement type structures.

7. The improved thyristor of claim 1, wherein: a plurality of first emitters and metal-insulator-semiconductors are provided and the first emitters are elongate parallel structures.

8. The improved thyristor of claim 1, wherein: a plurality of first emitters and metal-insulator-semiconductors are provided and the first emitters are annular structures.

9. The improved thyristor of claim 8, wherein:
the annular structures include which are radially aligned with one another;
the conductive layer is provided as a plurality of conductive rings between and insulatingly overlapping adjacent first emitters; and
radially extending electrical connections in the area of the openings connecting the conductive rings.

10. The improved thyristor of claim 1, and further comprising:
a plurality of the first electrodes contacting respective first emitters; and
a plate contacting each of said first electrodes.

* * * * *